United States Patent

Kasai

[11] Patent Number: 6,008,061
[45] Date of Patent: Dec. 28, 1999

[54] METHOD OF MANUFACTURING SEMICONDUCTOR DEVICE HAVING A TEST PAD

[75] Inventor: Kunihiro Kasai, Kanagawa-ken, Japan

[73] Assignee: Kabushiki Kaisha Toshiba, Kawasaki-ken, Japan

[21] Appl. No.: 08/948,481

[22] Filed: Oct. 10, 1997

[30] Foreign Application Priority Data

Oct. 11, 1996 [JP] Japan ................................. 8-269892

[51] Int. Cl.⁶ .......................... H01L 21/66; G01R 31/26
[52] U.S. Cl. .............................................. 438/18; 324/754
[58] Field of Search ....................... 438/18, 17; 324/754, 324/758

[56] References Cited

U.S. PATENT DOCUMENTS

| 4,104,785 | 8/1978 | Shiba et al. ................................. 29/574 |
| 4,628,590 | 12/1986 | Udo et al. .................................. 29/575 |
| 5,654,206 | 8/1997 | Merrill ....................................... 438/15 |
| 5,886,414 | 3/1999 | Galloway ................................... 257/784 |
| 5,899,703 | 5/1999 | Kalter et al. ............................... 438/18 |

Primary Examiner—Brian Dutton
Attorney, Agent, or Firm—Foley & Lardner

[57] ABSTRACT

A method for manufacturing a surface mounting type semiconductor device, to prevent a bump from forming on a test pad, by contacting with a probe needle at a die sort test in manufacturing a surface mounting type semiconductor device. A test pad is formed with a layer, made of the same components as a bonding pad, above the major surface of semiconductor substrate, where an IC is formed. A probe needle is applied onto the test pad to carry out a die sort test. Subsequently, for a conforming article, a resist film is patterned by a lithography technique, thus removing only the test pad. A bump is normally formed only on the remaining bonding pad, thereby avoiding a continuity failure at assembly and any unexpected short-circuits during the connection with the wiring.

20 Claims, 7 Drawing Sheets

METHOD OF MANUFACTURING SEMICONDUCTOR DEVICE HAVING A TEST PAD

Background of the Invention

1. Field of the Invention

The present invention relates to a method for manufacturing semiconductor equipment comprising integrated circuits, which is particularly used for a surface mounting type semiconductor device, which is mounted on a printed wiring board by a flip-chip connection.

In recent years, as integrated circuits (ICs) are being miniaturized and achieving higher speed technology in the manufacturing field for semiconductor equipment, a so-called flip-chip connection is now increasingly used to directly connect a semiconductor device to the wirings on a printed wiring board by means of bumps, such as solder formed on a bonding pad.

Usually, such a surface mounting type semiconductor device is subjected to a performance test (die sort test which includes electrical testing to determine whether the device is bad) before the formation of bumps, to determine whether ICs are good or bad. Then the conforming articles are supplied to the assembly line.

2. Description of Related Art

FIGS. 3(a) and (b) show a known semiconductor device with a bonding pad, which is also used as a test pad during the die sort test.

However, as shown in FIG. 3(a), for this semiconductor device, the die sort test is carried out by applying a probe needle 4 onto a bonding pad 3 exposed on a passivation film 2 that is formed on an interlayer insulating layer 1 on a semiconductor substrate.

Accordingly, as shown in FIG. 3(b), the bonding pad 3 becomes deformed by the contact of the probe needle 4 so that bump 5 cannot be normally formed on pad 3.

To solve this problem, a technique has been proposed to provide a dedicated test pad, for the die sort test, separately from the bonding pad for forming bumps.

FIGS. 4(a) and (b) show a semiconductor device wherein a test pad is formed separately from a bonding pad. FIG. 4(c) shows a plan view of a bonding pad structure having a bonding pad for testing. FIG. 4(d) shows a sectional view of FIG. 4(c) along dotted line A-A'.

In this semiconductor device, the bonding pad 3 is not deformed by the contact of the probe needle 4 during the die sort test, so that bump 5 can be normally formed on bonding pad 3.

However, this technique provides a lower assembly yield for the following reason: That is, since bump 5 is also formed on the test pad 6, as shown in FIG. 4(c), this results in a short-circuit in the connections with the other wirings in the assembly process, thereby lowering the assembly yield.

SUMMARY OF THE INVENTION

Therefore, an object of the present invention is to provide a method for manufacturing semiconductor equipment with improved assembly yield and reliability.

To achieve the afore purpose, a method for manufacturing semiconductor equipment according to the present invention includes the steps of:

forming an acceptance test pad for an IC with a layer made of the same components as a bonding pad for the IC onto a major surface of an interlayer insulating layer on a semiconductor substrate where the IC is formed; and removing the test pad after the acceptance test for the IC.

Further, a method for manufacturing semiconductor equipment according to the present invention comprising the steps of:

forming an acceptance test pad for the IC with a layer made of the same components as a bonding pad for the IC onto a major surface of an interlayer insulating layer on a semiconductor substrate;

carrying out the acceptance test for the IC by applying a probe needle to the test pad;

removing the test pad after the acceptance test;

covering with passivation film the major surface of the semiconductor substrate, including the bonding pad;

forming an opening on the passivation film so as to expose the bonding pad; and forming a bump on the exposed bonding pad.

Furthermore, a method for manufacturing semiconductor equipment according to the present invention comprises the steps of;

forming an acceptance test pad for the IC with a layer made of the same components as a bonding pad for the IC onto a major surface of the semiconductor substrate, where the IC is formed;

covering with passivation film the major surface of the semiconductor substrate, including the bonding pad and the test pad;

removing at least the passivation film on the test pad, so as to expose the test pad;

accomplishing the acceptance test for the IC by applying a probe needle to the test pad;

removing the test pad after the acceptance test; and forming a bump on the bonding pad.

The method for manufacturing semiconductor equipment according to the present invention can prevent a bump from forming on a test pad, thereby inhibiting a bump being formed on a test pad, and causing a short-circuit in the connection with other wiring during assembly.

DETAILED DESCRIPTION OF THE PREFERRED EMBODIMENTS

A first embodiment of the present invention will be described with reference to the accompanying drawings.

FIGS. 1(a) to (e) show schematically a method for manufacturing a surface mounting type semiconductor device, according to the present invention.

Figure 1A:
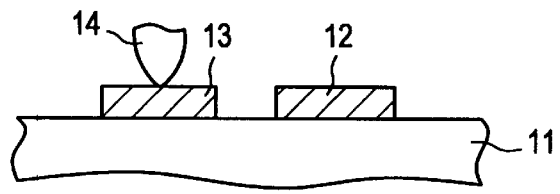
FIGS. 1(a) to (e) show a method for manufacturing a surface mounting type semiconductor device according to a first embodiment of the invention.

Referring to FIG. 1(a), the acceptance test pad 13 for the IC is formed on the major surface of interlayer insulating layer (formed of $SiO_2$)11 on a semiconductor substrate on which the IC is formed, simultaneously with the formation of bonding pad 12 for the IC.

The test pad 13 has a width of about 150 μm, and is formed with a layer made of the same components, for example Al, as the bonding pad 12, and is partially connected to the bonding pad 12. The distance between the test pad 13 and the bonding pad 12 is about 100 μm.

Before the formation of passivation film 16, the probe needle 14 is applied to the test pad 13 to carry out a die sort test as an acceptance test for the IC.

Since the step shown in FIG 1(a) is performed only for a simple operational check, it does not always require a passivation film.

Figure 1B:
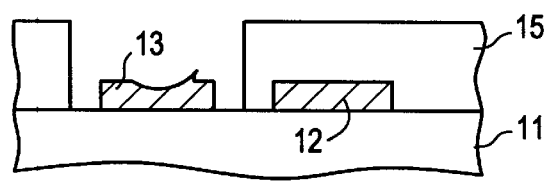

For a product determined to be a conforming article at the die sort test, a resist film 15 is patterned, for example, by using a lithography technique, as shown in FIG. 1(b).

Figure 1C:
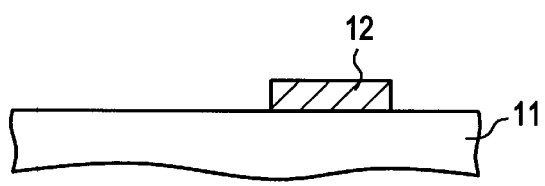

Next, only test pad 13 is removed using etching techniques, such as reactive ion etching (RIE), and chemical dry etching (CDE), leaving only bonding pad 12, as shown in FIG. 1(c). Also, the test pad may be removed using a Wet etching technique done by dipping the test pad 13 in a solution such as $H_2O$, $CH_3COOH$, $HNO_3$, or $H_3PO_4$.

Figure 1D:
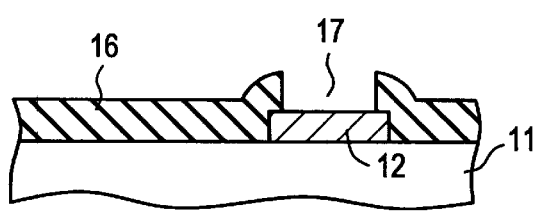

Subsequently, a passivation film 16 is stacked on the interlayer insulating layer 11 together with bonding pad 12, and an opening 17 is formed to expose the bonding pad 12, as shown in FIG. 1(d).

Figure 1E:
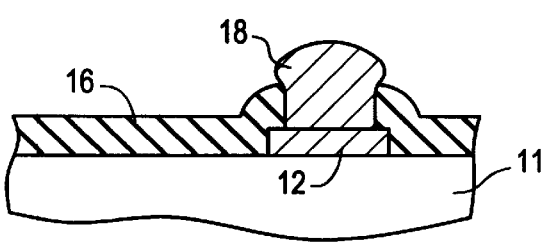

After the bonding pad 12 is exposed, a bump formation step is implemented to form a bump 18, made of solder, etc., on the bonding pad 12, as shown in FIG. 1(e).

Before this step, the test pad 13, which may be deformed by contacting with probe needle 14, has already been removed. Therefore, no bump is formed on test pad 13, while bump 18 is normally formed on the bonding pad 12.

The semiconductor device, wherein a bump 18 has been normally formed, is sent to the next assembly line to be made into a product.

As described above, the manufacturing process according to the present invention prevents bumps from being formed on the test pads.

In other words, the process, according to the present invention, removes the test pad, which can be deformed by the contact of the probe needle after the die sort test. Thus, no bump is formed on the test pad, thereby avoiding conventional problems where the bump formed on the test pad causes a short-circuit in the connection with other wiring in the assembly process. This process prevents the assembly yield from lowering.

Further, the test pad is formed with a layer made of the same components as the bonding pad and the die sort test is carried out, so that a simpler structure with better reliability can be provided, compared to the conventional case in which a test pad is formed with different components.

Particularly, in the conventional method where the test pad is covered with a passivation film, it is difficult to completely cover the deformed test pad. Thus, the method of the present invention prevents a bump from forming on a test pad.

Furthermore, in the aforesaid embodiment, according to the present invention, the die sort test is implemented before forming the passivation film. However, the die sort test may also be carried out after forming the passivation film.

FIGS. 2(a) to (d) show a second embodiment, according to the present invention, wherein the die sort test is carried out, after forming the passivation film.

Figure 2A:
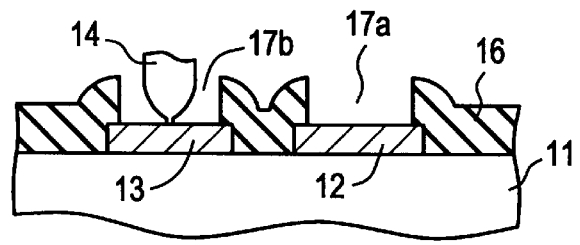
FIGS. 2(a) to (d) show a method for manufacturing a surface mounting type semiconductor device according to a second embodiment of the invention.

In this embodiment, as shown in FIG. 2(a), the passivation film 16 is formed on interlayer insulating layer 11 together with the bonding pad 12 and the test pad 13, and openings 17a and 17b corresponding thereto, respectively, are provided on passivation film 16. Next, a probe needle 14 is applied to the test pad 13 exposed on the passivation film 16, and then the die sort test is performed as the acceptance test for the IC.

Figure 2B:
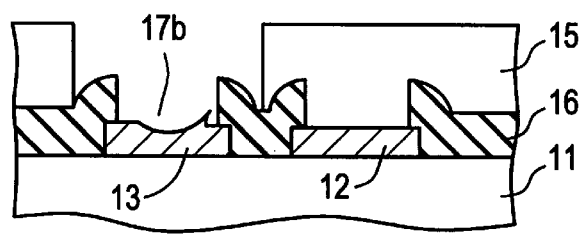
Figure 2C:
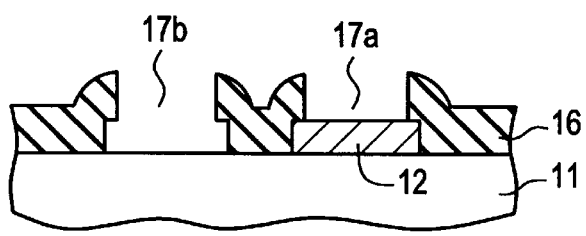

Subsequently, for a product determined to be conforming at the die sort test, a resist film 15 is patterned, for example, by using a lithography technique, as shown in FIG. 2(b), and then only test pad 13 is removed using etching techniques, such as CDE, as shown in FIG. 2(c), Also, as in the first embodiment, the test pad may be removed using Wet etching technique.

Figure 2D:
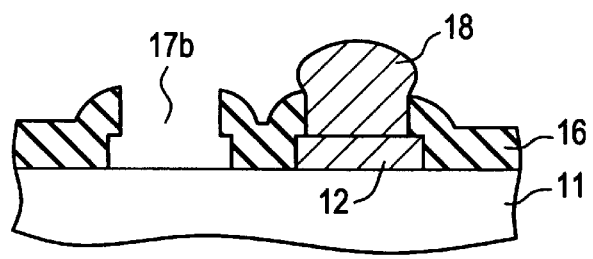
Figure 3A:
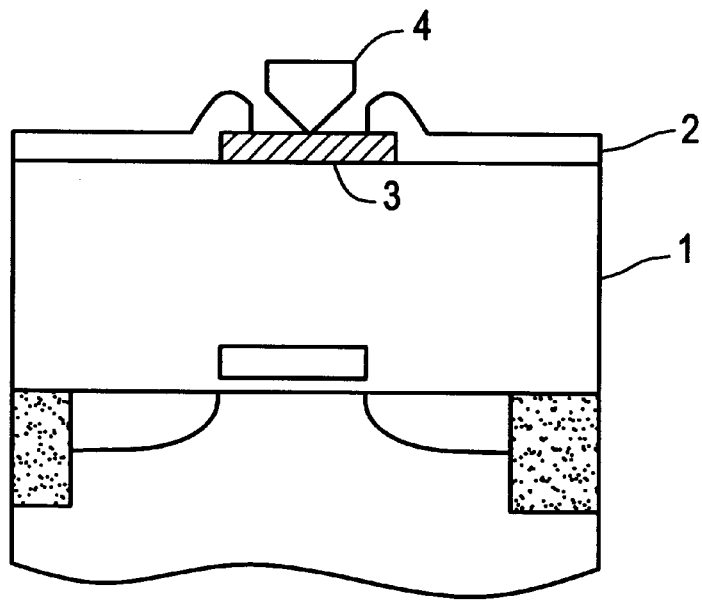
FIGS. 3(a) and (b) show a conventional method for manufacturing a surface mounting type semiconductor device, illustrating the prior art and the problems pertaining thereto.
Figure 3B:
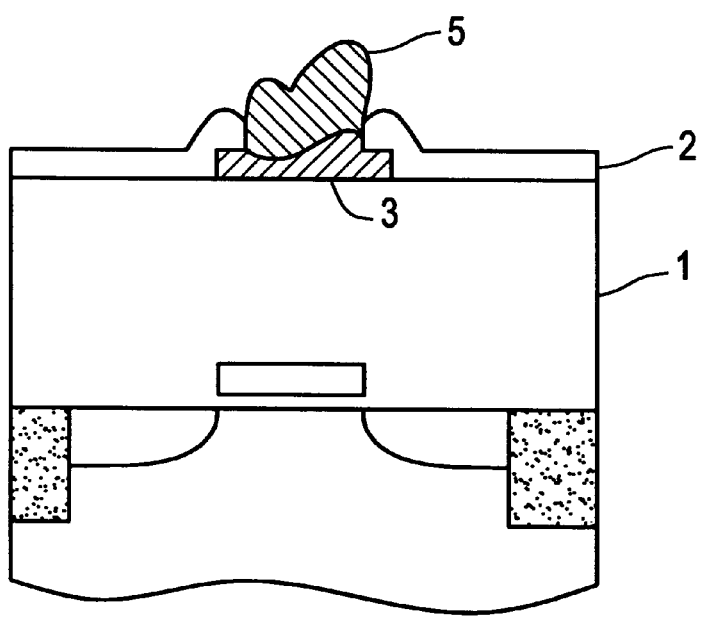
Figure 4A:
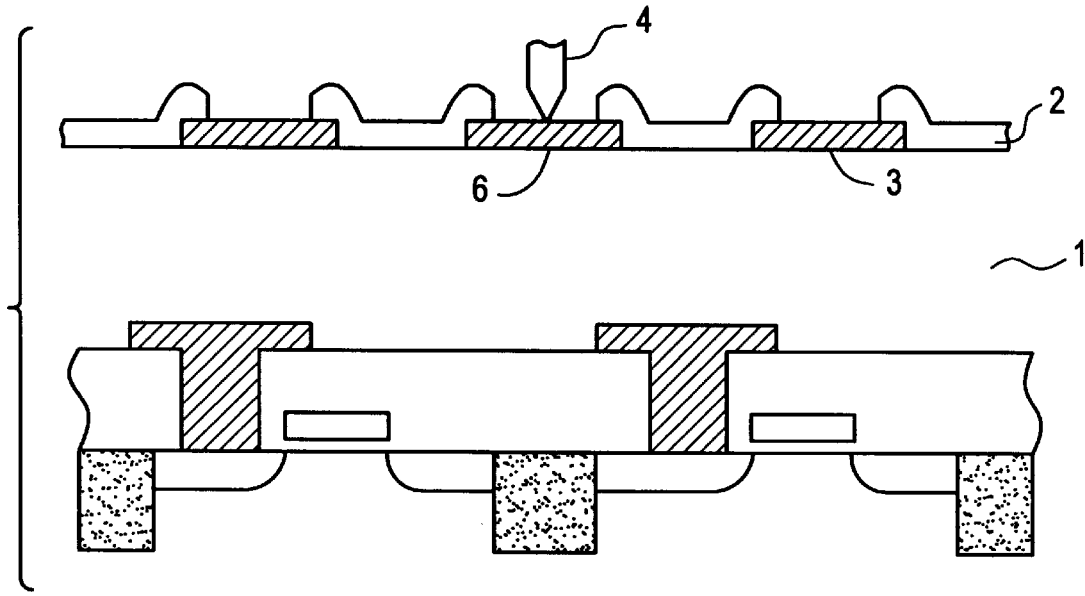
FIGS. 4(a) and (b) show a conventional method for manufacturing a surface mounting type semiconductor device.
Figure 4B:
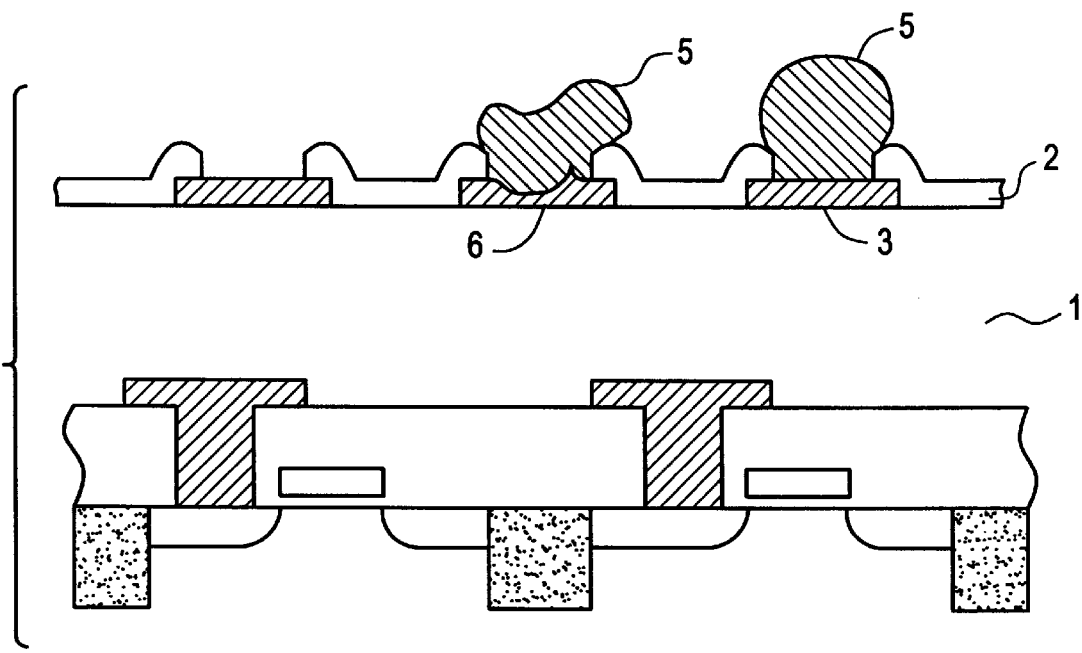
FIGS. 4(c) and (d) show a plan view and a sectional view of a conventional surface of the surface mounting type semiconductor device in detail.
Figure 4C:
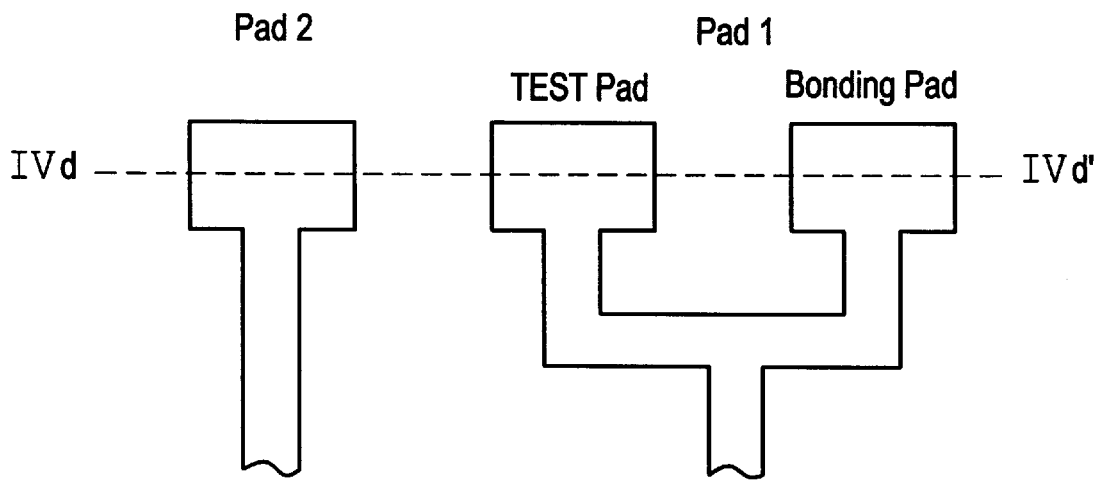
Figure 4D:
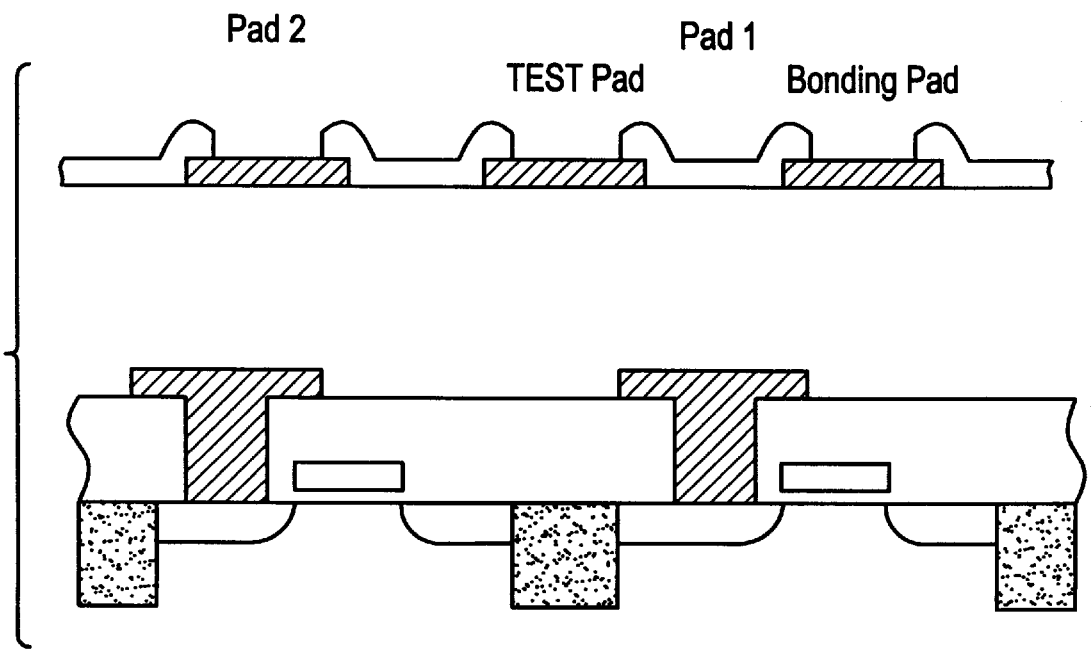

Thus, only bonding pad 12 has a bump formation; a bump 18 made of solder, as shown in FIG. 2(d).

As described above, the second embodiment shows the die sort test on a surface of the bonding pad 12 uncovered by the passivation film 16. However, the die sort test may also be carried out on the remaining surface covered by the passivation film 16.

FIGS. 5(a) to (d) show a third embodiment, according to the present invention, wherein a part of the passivation film 16 contacting the surface of the bonding pad 12 is removed after die sort test.

Figure 5A:
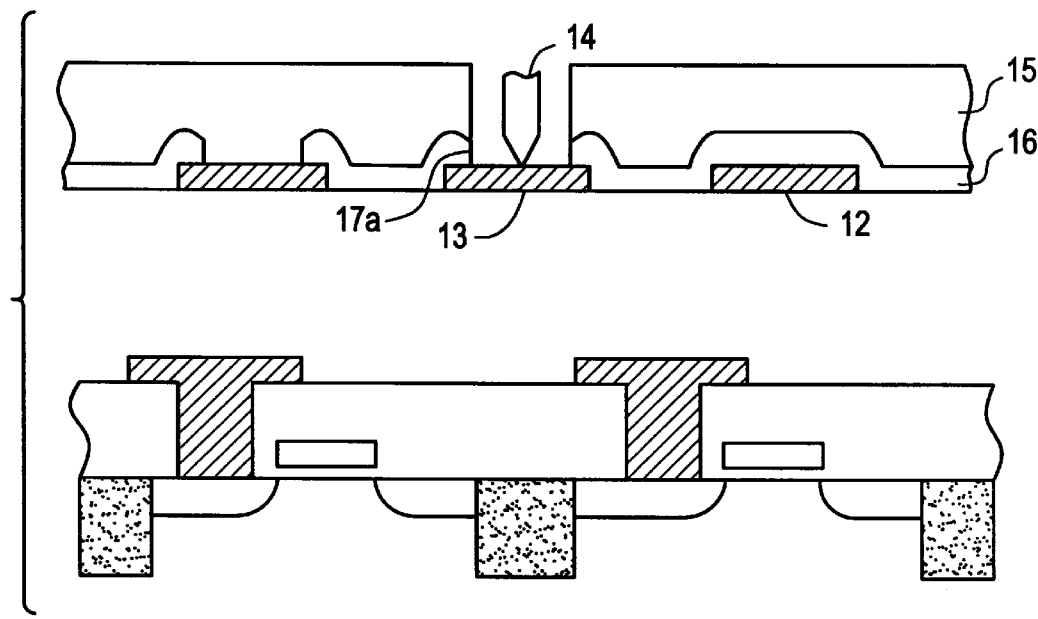
FIG. 5(a) to (d) show a method for manufacturing a surface mounting type semiconductor device according to a third embodiment of the invention.

In this embodiment, as shown in FIG. 5(a), the passivation film 16 is formed on interlayer insulating layer 11 together with the bonding pad 12 and the test pad 13, and openings 17a corresponding to the test pad 13 are provided on passivation film 16. A resist film 15, covering the passivation film 16, is also patterned, for example, by using a lithography technique, in accordance with the opening 17a. Next, a probe needle 14 is applied to the test pad 13 exposed on the passivation film 16, and then the die sort test is performed as the acceptance test for the IC.

Figure 5B:
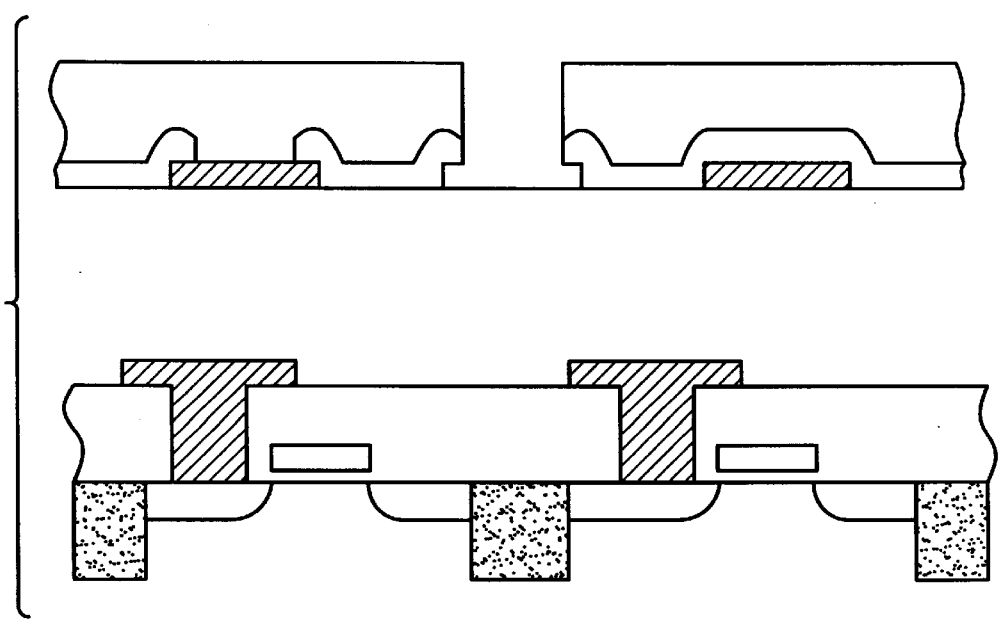

Subsequently, for a product determined to be conforming at the die sort test, only test pad 13 is removed using etching techniques, such as CDE, as shown in FIG. 5(b). Also, as in the second embodiment, the test pad may be removed using Wet etching technique.

Figure 5C:
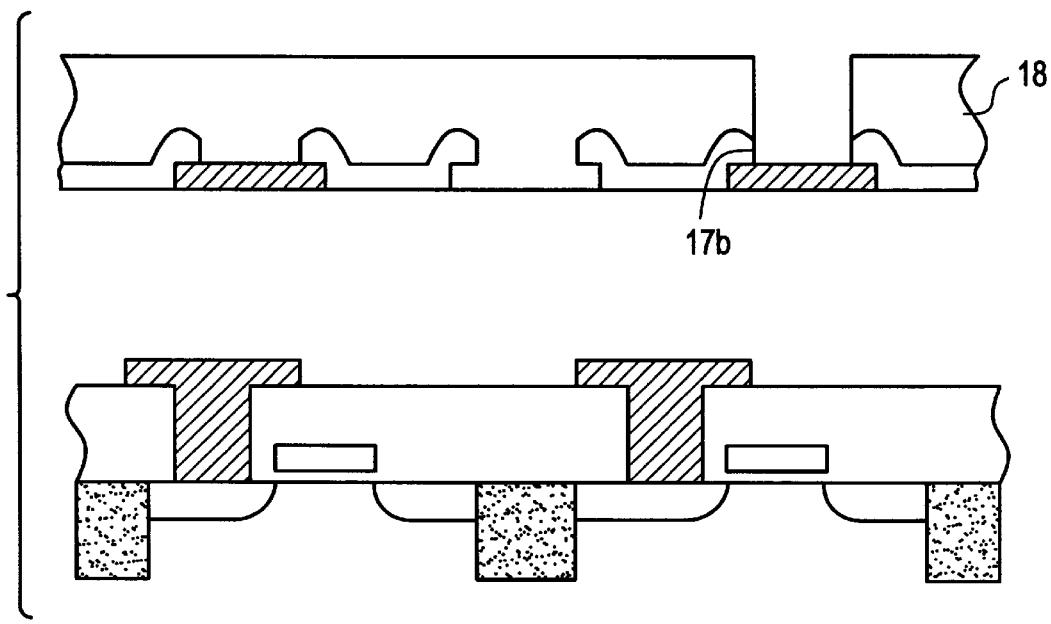

After removing the test pad 13, the resist film 15 is removed using a method of $O_2$ ashing. Subsequently, a resist film 18 is formed on the passivation film 16 and patterned so that a part of the passivation film 16 contacting a surface of the bonding pad 12 is removed, for example, by using a lithography technique. And then using, for example, a reactive ion etching, the surface of the bonding pad 12 is exposed as shown in FIG. 5(c).

Figure 5D:
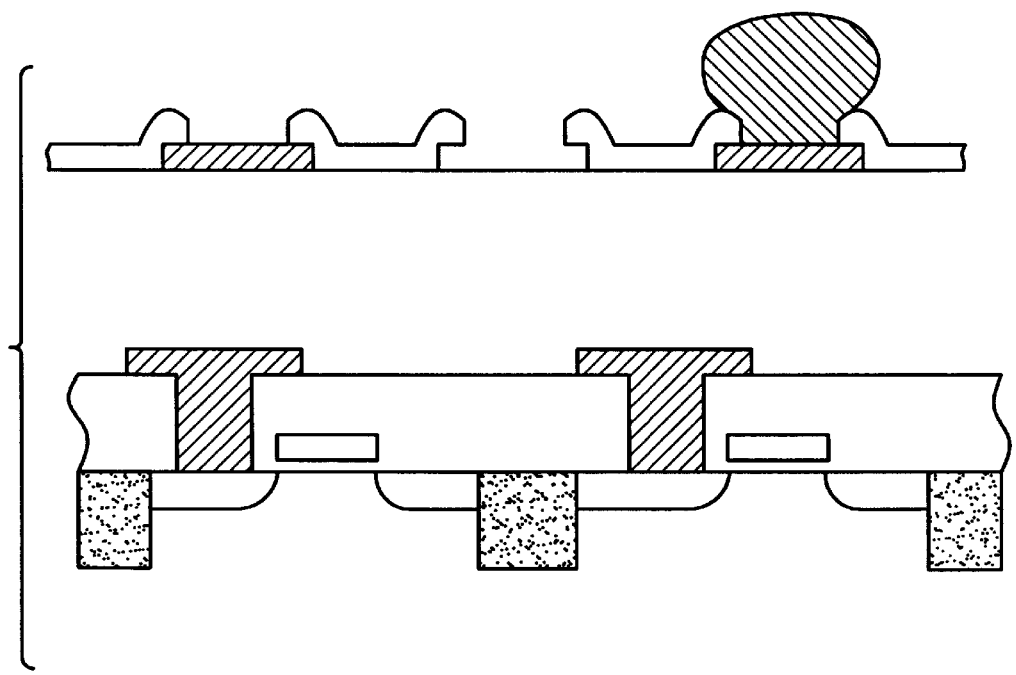

Thus, only bonding pad 12 has a bump formation; a bump 18 made of solder, as shown in FIG. 5(d).

As described above, the present method prevents a bump from forming on the test pad, which could be deformed by a probe needle during the die sort test, while allowing the bump to normally form on the bonding pad. Accordingly, the method makes it possible to avoid continuity failure during assembly and/or an unexpected short-circuits during the connection with the wiring, thereby preventing assembly yield from lowering. The invention is not restricted to the embodiment conditions as described above, but can, of course be implemented in various ways, without departing from the spirit of the invention.

What is claimed is:

1. A method of manufacturing a semiconductor device having a bonding pad, comprising the steps of:

a) contacting a test pad with a probe needle for a die sort test;

b) covering the bonding pad with an etching mask;

c) removing the test pad by etching; and d) forming a bump on the bonding pad.

2. The method according to claim 1, wherein the test pad is partially connected to the bonding pad.

3. The method according to claim 1, wherein the test pad is formed simultaneously with the bonding pad.

4. The method according to claim 1, wherein the removing step includes Chemical dry etching.

5. The method according to claim 1, wherein the removing step includes reactive ion etching.

6. The method according to claim 1, wherein the removing step includes wet etching.

7. A method for manufacturing a semiconductor device, comprising the steps of:

forming an acceptance test pad for an IC with a layer made of a same component as a bonding pad for the IC above a major surface of a semiconductor substrate where the IC is formed; and removing the acceptance test pad after performing an acceptance test for the IC.

8. The method according to claim 7, wherein the test pad is partially connected to the bonding pad.

9. The method according to claim 7, wherein the acceptance test is done by applying a probe needle to the test pad.

10. The method according to claim 7, wherein the removing step includes Chemical dry etching.

11. The method according to claim 7, wherein the removing step includes wet etching.

12. A method for manufacturing a semiconductor device, comprising the steps of:

forming an acceptance test pad for an IC with a layer made of same components as a bonding pad for the IC above a major surface of a semiconductor substrate where the IC is formed;

performing an acceptance test for the IC by applying a probe needle to the test pad;

removing the test pad after the acceptance test;

covering with a passivation film the major surface of the semiconductor substrate, including the bonding pad;

forming an opening on the passivation film so as to expose the bonding pad; and forming a bump on the exposed bonding pad.

13. The method according to claim 12, wherein the test pad is partially connected to the bonding pad.

14. The method according to claim 12, wherein the removing step includes Chemical dry etching.

15. The method according to claim 12, wherein the removing step includes wet etching.

16. A method for manufacturing a semiconductor device, comprising the steps of;

forming an acceptance test pad for an IC with a layer made of same components as a bonding pad for the IC above a major surface of a semiconductor substrate where the IC is formed;

covering with a passivation film the major surface of the semiconductor substrate, including the bonding pad and the test pad;

removing at least the passivation film from the test pad, so as to expose the test pad;

performing an acceptance test for the IC by applying a probe needle to the test pad;

removing the test pad after the acceptance test; and forming a bump on the bonding pad.

17. The method according to claim 16, wherein the passivation film is removed simultaneously from the test pad and the bonding pad.

18. The method according to claim 17, wherein the test pad is partially connected to the bonding pad.

19. A method for manufacturing a semiconductor device, comprising the steps of;

forming an acceptance test pad for an IC with a layer made of same components as a bonding pad for the IC above a major surface of a semiconductor substrate where the IC is formed;

covering with a passivation film the major surface of the semiconductor substrate, including the bonding pad and the test pad;

removing the passivation film from the test pad, so as to expose the test pad;

performing an acceptance test for the IC by applying a probe needle to the test pad;

removing the test pad after the acceptance test;

removing the passivation film from the bonding pad, so as to expose the bonding pad; and forming a bump on the bonding pad.

20. The method according to claim 19, wherein the test pad is partially connected to the bonding pad.

* * * * *